(12) United States Patent
Karpov et al.

(10) Patent No.: US 11,985,909 B2
(45) Date of Patent: May 14, 2024

(54) FABRICATION OF STACKABLE EMBEDDED EDRAM USING A BINARY ALLOY BASED ON ANTIMONY

(71) Applicant: Intel Corporation, Santa Clara, CA (US)

(72) Inventors: Elijah Karpov, Portland, OR (US); Mauro Kobrinsky, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1009 days.

(21) Appl. No.: 16/435,875

(22) Filed: Jun. 10, 2019

(65) Prior Publication Data

US 2020/0388753 A1 Dec. 10, 2020

(51) Int. Cl.
| | | |
|---|---|---|
| *G11C 11/00* | (2006.01) | |
| *G11C 13/00* | (2006.01) | |
| *H10B 63/00* | (2023.01) | |
| *H10N 70/00* | (2023.01) | |
| *H10N 70/20* | (2023.01) | |

(52) U.S. Cl.
CPC ....... *H10N 70/231* (2023.02); *G11C 13/0004* (2013.01); *G11C 13/0069* (2013.01); *G11C 13/0097* (2013.01); *H10B 63/20* (2023.02); *H10B 63/24* (2023.02); *H10B 63/30* (2023.02); *H10N 70/826* (2023.02); *H10N 70/841* (2023.02); *H10N 70/8828* (2023.02); *G11C 13/004* (2013.01); *G11C 2013/0092* (2013.01); *G11C 2213/52* (2013.01); *G11C 2213/72* (2013.01); *G11C 2213/79* (2013.01)

(58) Field of Classification Search
CPC ............ G11C 13/0004; G11C 13/0069; G11C 13/0097
USPC .......................................................... 365/163
See application file for complete search history.

(56) References Cited

U.S. PATENT DOCUMENTS

| | | | | |
|---|---|---|---|---|
| 8,648,323 | B2* | 2/2014 | Yamamoto | H10N 70/8418 257/3 |
| 2006/0266991 | A1* | 11/2006 | Chang | H01L 45/1233 257/4 |
| 2009/0020741 | A1* | 1/2009 | Park | H01L 45/06 257/E47.001 |
| 2009/0310402 | A1* | 12/2009 | Parkinson | G11C 13/0004 365/163 |
| 2010/0096609 | A1* | 4/2010 | Kim | H01L 27/2409 257/E47.001 |
| 2010/0110780 | A1* | 5/2010 | Wicker | G11C 13/0011 365/163 |
| 2010/0213433 | A1* | 8/2010 | Yamamoto | H01L 27/101 257/E47.001 |

(Continued)

*Primary Examiner* — Vu A Le
(74) *Attorney, Agent, or Firm* — Schwabe, Williamson & Wyatt, P.C.

(57) ABSTRACT

Embodiments disclosed herein include memory bitcells and methods of forming such memory bitcells. In an embodiment, the memory bitcell is part of an embedded DRAM (eDRAM) memory device. In an embodiment, the memory bitcell comprises a substrate and a storage element embedded in the substrate. In an embodiment, the storage element comprises a phase changing material that comprises a binary alloy. In an embodiment, the memory bitcell further comprises a first electrode over a first surface of the storage element, and a second electrode over a second surface of the storage element.

25 Claims, 6 Drawing Sheets

(56) References Cited

U.S. PATENT DOCUMENTS

| | | | | |
|---|---|---|---|---|
| 2011/0156132 A1* | 6/2011 | Kiyotoshi | ............ | H01L 29/7926 |
| | | | | 257/326 |
| 2011/0233646 A1* | 9/2011 | Mizushima | ............ | H10B 43/20 |
| | | | | 257/E21.409 |
| 2012/0294072 A1* | 11/2012 | Loke | .................... | G11C 11/5678 |
| | | | | 365/163 |
| 2013/0257493 A1* | 10/2013 | Dike | .................... | H03K 3/0375 |
| | | | | 327/155 |
| 2013/0292631 A1* | 11/2013 | Chin | .................... | H10N 70/023 |
| | | | | 257/4 |
| 2014/0170831 A1* | 6/2014 | BrightSky | ............ | H01L 45/1253 |
| | | | | 438/382 |
| 2014/0268991 A1* | 9/2014 | Hu | .................... | G11C 13/0002 |
| | | | | 257/2 |
| 2015/0144860 A1* | 5/2015 | Lin | .................... | H01L 23/528 |
| | | | | 257/4 |
| 2016/0093804 A1* | 3/2016 | Petz | .................... | H10N 70/231 |
| | | | | 257/4 |
| 2016/0380194 A1* | 12/2016 | Karpov | ............... | H01L 45/1293 |
| | | | | 257/4 |
| 2020/0006652 A1* | 1/2020 | Cheng | .................... | H10N 70/011 |
| 2020/0106011 A1* | 4/2020 | Chen | .................... | H01L 27/2436 |
| 2020/0185603 A1* | 6/2020 | Chen | .................... | H01L 21/67248 |
| 2020/0388752 A1* | 12/2020 | Bai | .................... | H10N 70/021 |

* cited by examiner

FABRICATION OF STACKABLE EMBEDDED EDRAM USING A BINARY ALLOY BASED ON ANTIMONY

TECHNICAL FIELD

Embodiments of the disclosure are in the field of semiconductor structures and processing and, in particular, to embedded DRAM (eDRAM) comprising phase change alloys for the storage element in the bitcells.

BACKGROUND

Current dynamic access memory (DRAM) and embedded DRAM (eDRAM) are limited in the ability to scale towards smaller devices. Particularly, the scaling is limited by the scaling of the storage capacitor. As the storage capacitor continues to decrease in size, the amount of charge capable of being stored will continue to be reduced to the point where accurately detecting whether there is charge on the capacitor becomes exceedingly difficult.

Accordingly, there has been a drive to find storage mediums to replace the use of capacitors. Phase change memory (PCM) devices use phase change materials in order to store a bit as a 1 or 0. Particularly, a first state of the phase change material is a crystalline or partially crystalline phase, and a second state of the phase change material is a substantially amorphous phase. The first state has a significantly lower resistivity than the second state. Accordingly, the PCM may read the bitcell by determining whether the bitcell is resistive or conducting. The state of the phase change material is non-volatile. That is, when set in either the first state or the second state, that state is retained until changed by another programming event. Accordingly, the state is not lost when power is removed.

While PCM devices allow for a non-volatile storage medium, PCM devices have not yet been widely adopted. The adoption of PCM devices has been slow for several reasons. One reason being that the switching time of the phase change material is significantly slower than existing DRAM solutions. Additionally, reliability of existing PCM devices is limited due to electromigration issues, such as element separation.

DESCRIPTION OF THE EMBODIMENTS

Figure 1:
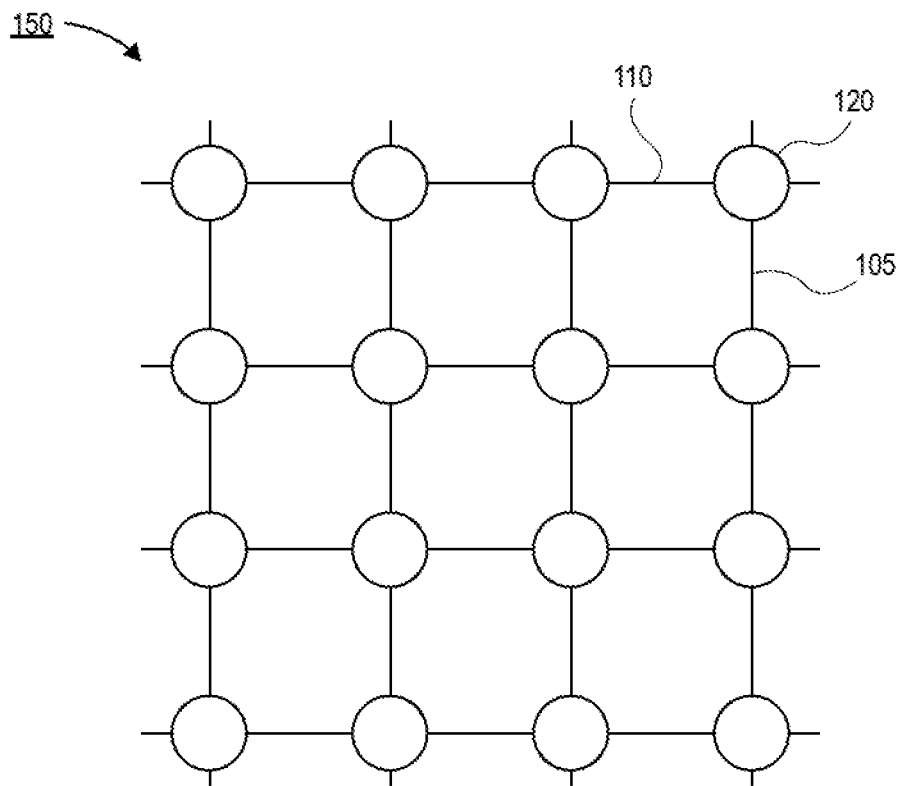
FIG. 1 is a schematic of an array of phase change memory (PCM) bitcells, in accordance with an embodiment.

Embodiments described herein comprise memory devices that comprise bitcells with phase change alloys. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, phase change memory (PCM) devices currently suffer from slow switching speeds. Currently, most PCM devices utilize ternary or quaternary alloys, such as $Ge_2Sb_2Te_5$ or other GST-based alloys. Such alloys are also particularly susceptible to defects caused by electromigration. Accordingly, reliability of PCM devices that use existing GST alloys is not optimum. Therefore, embodiments disclosed herein include PCM devices that include storage elements that are formed with a binary alloy composition. Particularly, embodiments that include a binary alloy that comprises antimony (Sb) and tellurium (Te), with an atomic weight percentage of Sb being greater than an atomic weight percentage of Te. For example, it has been shown that $Sb_xTe_y$ (x>y) exhibits a switching speed for both SET and RESET of less than 40 ns, and in some of the formulations the switching speed for both SET and RESET may be approximately 5 ns or less. With proper barrier layers and short pulses with optimized polarity and amplitude, and because such compositions can exist as solid solution, the memory cell can exhibit less significant electromigration for thicknesses of 40 nm or less. In particular, the binary composition exhibits better endurance when SET and RESET pulses are of opposite polarity.

Referring now to FIG. 1, a schematic of memory device 150 is shown, in accordance with an embodiment. In an embodiment, the memory device 150 may comprise an array of bitcells 120. Each of the bitcells 120 may be positioned at an intersection of a word line 110 and a bit line 105. Accordingly, individual bitcells 120 in the array may be addressed.

Figure 2:
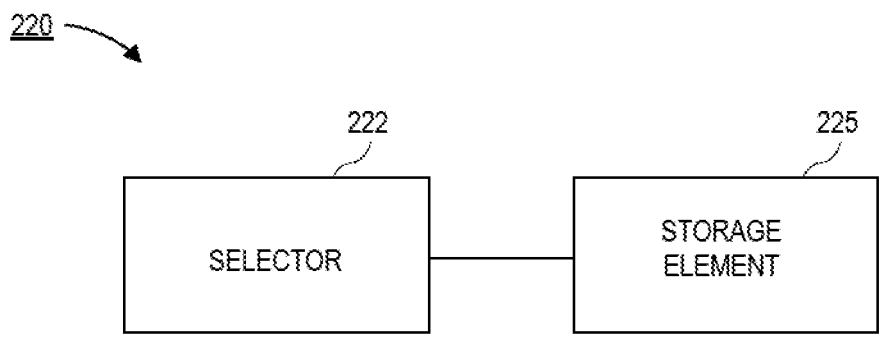
FIG. 2 is a schematic of the memory bitcell with a PCM storage element and selector, in accordance with an embodiment.

Referring now to FIG. 2, a schematic of a bitcell 220 is shown, in accordance with an embodiment. In an embodiment, the bitcells 220 may comprise a storage element 225 that is electrically coupled to a selector 222. The storage element 225 may comprise a phase change material. For example, the phase change material may comprise a binary alloy of Sb and Te. In a particular embodiment, the phase change material may comprise an atomic weight percentage of Sb that is greater than an atomic weight percentage of Te. For example, the phase change material may comprise $Sb_7Te_3$. A more detailed description of the storage element 225 is described below with respect to FIGS. 3A-3C.

In an embodiment, the selector 222 of the bitcell 220 may be any suitable device that allows for the storage element 225 to be addressed. In an embodiment, the selector 222 may be a transistor or a diode. In the case where the selector 222 is a transistor, the selector 222 may be a silicon transistor (or any other semiconductor based transistor). Embodiments may also include a selector 222 that is a thin film transistor (TFT). Such an embodiment may be particularly beneficial when the bitcell 220 is located in dielectric layers (i.e., the back end) of a die since thin film transistors may be fabricated with low temperature processes. In the case where the selector 222 is a diode, the selector 222 may be a silicon diode (or any other semiconductor based diode). Embodiments may also include a selector 222 that is a thin film diode. For example, a thin film diode may be an ovonic threshold switch (OTS).

Figure 3A:
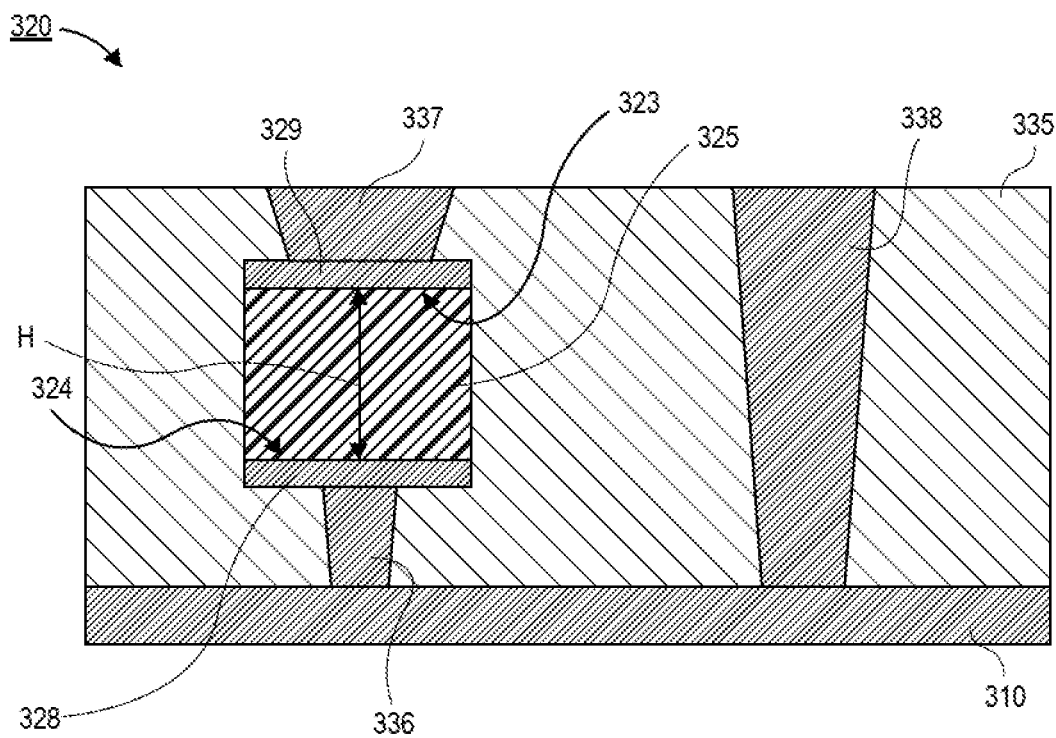
FIG. 3A is a cross-sectional illustration of a PCM storage element, in accordance with an embodiment.
Figure 3B:
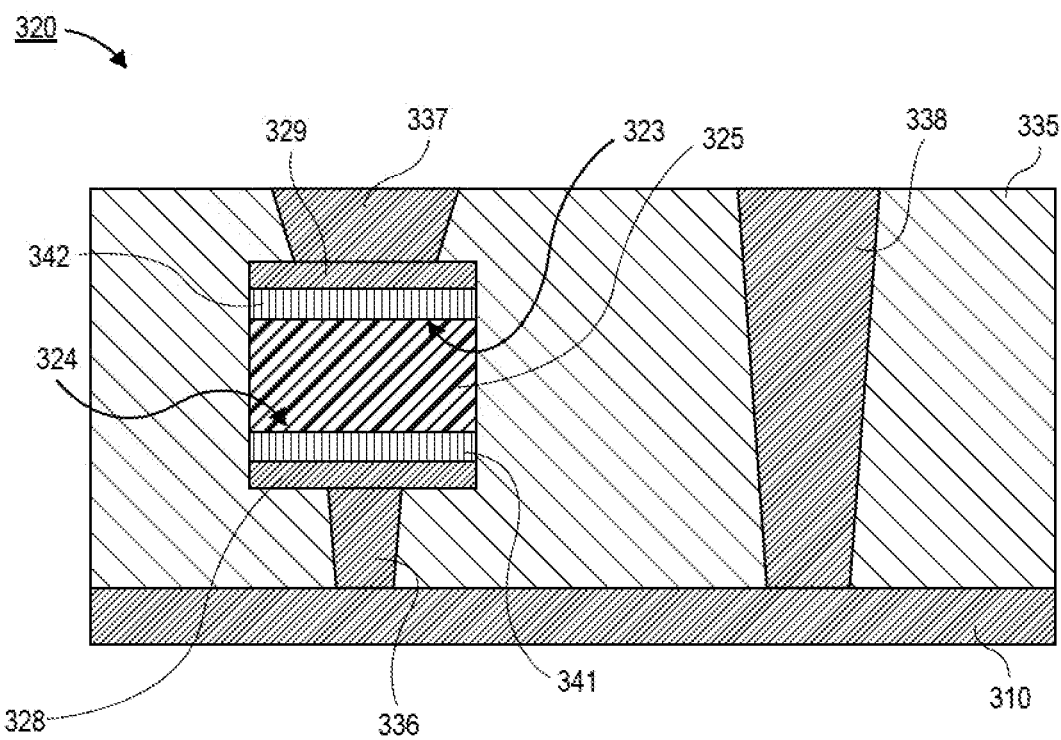
FIG. 3B is a cross-sectional illustration of a PCM storage element with diffusion barriers, in accordance with an embodiment.
Figure 3C:
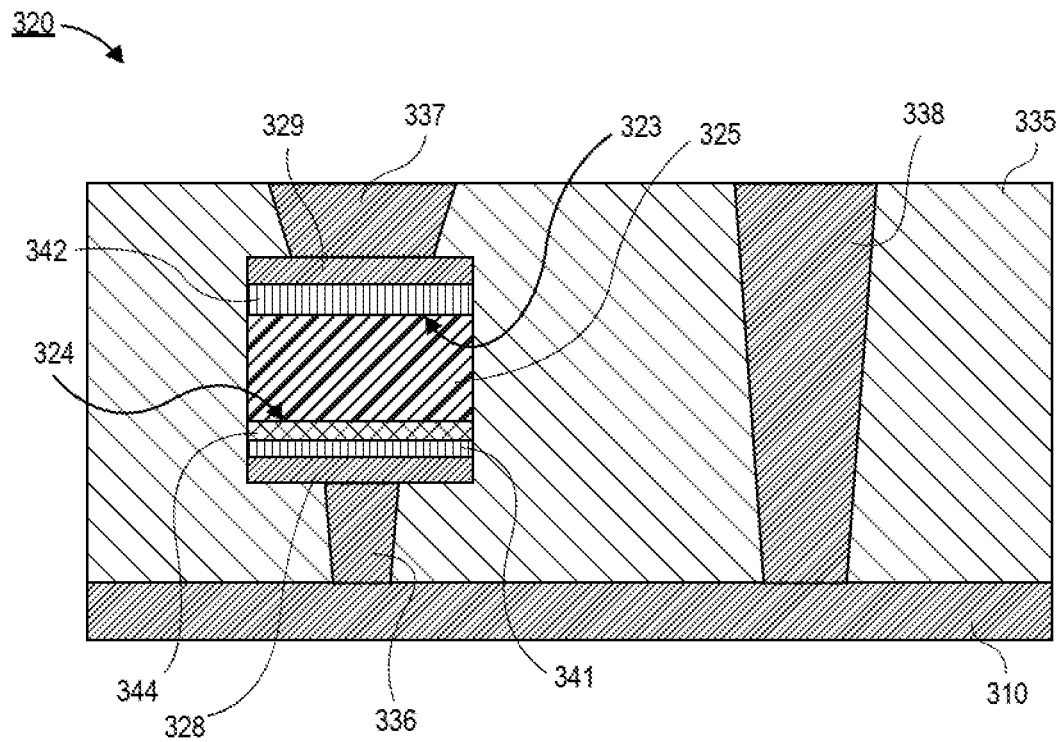
FIG. 3C is a cross-sectional illustration of a PCM storage element with diffusion barriers and an oxide layer, in accordance with an embodiment.

Referring now to FIGS. 3A-3C, cross-sectional illustrations of various bitcells 320 are shown, in accordance with different embodiments. As shown, the bitcells 320 are embedded in a substrate layer 335. The substrate layer 335 may be an interlayer dielectric (ILD) material. The substrate 335 may be part of the back end of a semiconductor die. That is, the substrate layer 335 may be positioned over a semiconductor substrate (not shown). Accordingly, the memory fabricated with such bitcells 320 may be referred to herein as embedded DRAM (eDRAM) memory devices. As used throughout the present description, ILD material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. In the illustrated embodiments, a single bitcell 320 is shown. However, it is to be appreciated that an array of any number of bitcells 320 may be embedded in the substrate 335. In FIGS. 3A-3C, the selector is omitted from the bitcell 320 and only the storage element 325 is illustrated in order to not obscure embodiments disclosed herein.

Referring now to FIG. 3A, a cross-sectional illustration of a bitcell 320 is shown, in accordance with an embodiment. In an embodiment, the bitcell 320 may comprise a storage element 325. The storage element 325 is a phase change material. That is, the storage element 325 is capable of being switched between a first state (i.e., a high resistance state) and a second state (i.e., a low resistance state). For example, the first state may comprise a substantially amorphous crystal structure, and the second state may comprise at least a partially crystalline crystal structure. In an embodiment, the storage element 325 may be switched between the first state and the second state by raising the temperature of the storage element. In some embodiments, the storage element 325 may be heated with a dedicated heater (not shown) that is thermally coupled to the storage element 325. In other embodiments, the storage element 325 may be heated through Joule heating or the like.

In an embodiment, the phase changing material of the storage element 325 is a binary alloy. For example, the phase changing material may comprise Sb and Te. In a particular embodiment, the phase changing material may comprise an atomic percentage of Sb that is greater than an atomic percentage of Te. For example, the phase changing material of the storage element 325 may comprise $Sb_7Te_3$. It has been found that binary alloys such as those described herein provide excellent switching speeds and low electromigration when compared to existing ternary and quaternary GST alloys that are used in existing PCM devices. As will be described in greater detail below with respect to FIG. 5, embodiments disclosed herein allow for switching speeds of 40 ns or lower. In some embodiments, the switching speed may be approximately 25 ns or lower, or 5 ns or lower.

In an embodiment, the storage element 325 may have a first surface 324 and a second surface 323 opposite the first surface 324. The distance H between the first surface 324 and the second surface 323 may be less than 50 nm. In a particular embodiment, the distance H may be between approximately 10 nm and 50 nm. Accordingly, the storage element 325 allows for improved scaling compared to existing DRAM devices that use capacitors for storage elements. Particularly, as the size of the capacitor decreases, it becomes more difficult to determine whether there is charge stored on the capacitor. In contrast, the phase change material of the storage element 325 relies on resistance differences between states, which allows for improved scaling.

In an embodiment, a first electrode 328 may be positioned over the first surface 324 of the storage element 325, and a second electrode 329 may be positioned over the second surface 323 of the storage element 325. The first electrode 328 may be electrically coupled to a wordline 310 (or alternatively to a bitline) by a via 336 or the like. In an embodiment, the wordline 310 may be electrically coupled to other circuitry (e.g., control circuitry) by a via 338 or any other conductive interconnects in the substrate 335. The second electrode 329 may be contacted by a via 337 that is coupled to other circuitry (e.g., control circuitry).

In an embodiment, as is also used throughout the present description, metal layers, electrodes, or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

Referring now to FIG. 3B, a cross-sectional illustration of a bitcell 320 is shown, in accordance with an additional embodiment. In an embodiment, the bitcell 320 in FIG. 3B may be substantially similar to the bitcell 320 in FIG. 3A with the exception that diffusion barrier layers 342 and 341 are also included. The first diffusion barrier layer 341 may be positioned between the first electrode 328 and the first surface 324 of the storage element 325, and the second diffusion barrier layer 342 may be positioned between the second electrode 329 and the second surface 323 of the storage element 325. The first diffusion barrier layer 341 and the second diffusion barrier layer 342 may be any suitable material that is used to mitigate electromigration in the bitcell 320. For example, the first diffusion barrier layer 341 and the second diffusion barrier layer 342 may comprise a refractory metal. In some embodiments, the refractory metal may comprise iridium (Ir), tungsten (W), tungsten nitride (WN), tantalum nitride (TaN), tantalum (Ta), ruthenium (Ru), or the like. In an embodiment, a thickness of the first diffusion barrier layer 341 and a thickness of the second diffusion barrier layer 342 may be less than 10 nm. In a particular embodiment, the thicknesses of the first diffusion barrier layer 341 and the second diffusion barrier layer 342 may be between approximately 2 nm and 10 nm. In a particular embodiment, the first diffusion barrier layer 341 and the second diffusion barrier layer 342 may be between approximately 2 nm and 4 nm.

Referring now to FIG. 3C, a cross-sectional illustration of a bitcell 320 is shown, in accordance with an additional embodiment. In an embodiment, the bitcell 320 may be substantially similar to the bitcell 320 in FIG. 3B with the exception that an oxide layer 344 is positioned between the first diffusion barrier layer 341 and the first surface 324 of the storage element 325. In an embodiment, an additional oxide layer 344 may be positioned between the second diffusion barrier layer 342 and the second surface 323 of the storage element 325 (not shown). In an embodiment, the oxide layer 344 may be any suitable oxide material. For example, the oxide layer 344 may comprise hafnium and oxygen (e.g., $HfO_2$). In an embodiment, the thickness of the oxide layer 344 may be less than approximately 3 nm. In a particular embodiment, the thickness of the oxide layer 344 may be between approximately 0.5 nm and 3 nm.

Figure 4:
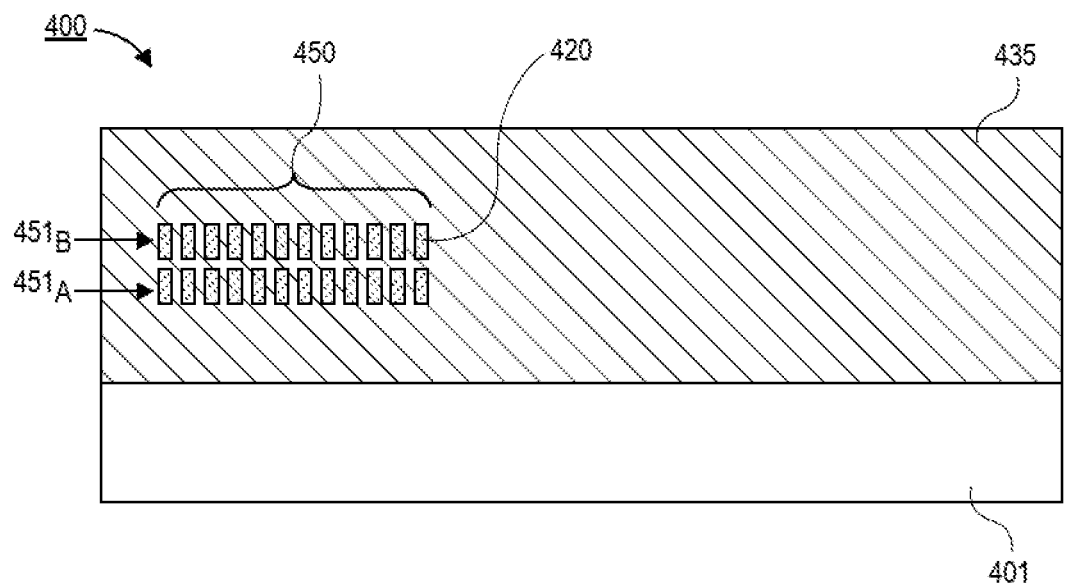
FIG. 4 is a cross-sectional illustration of a die that comprises a semiconductor substrate and a dielectric stack over the semiconductor substrate with an array of the PCM bitcells embedded in the dielectric stack, in accordance with an embodiment.

Referring now to FIG. 4, a cross-sectional illustration of a die 400 is shown, in accordance with an embodiment. The die 400 may comprise a semiconductor substrate 401 and a dielectric substrate 435 over the semiconductor substrate 401. The dielectric substrate 435 may be referred to as the back end of the die 400 in some embodiments. In an embodiment, the underlying semiconductor substrate 401 may be a general workpiece object used to manufacture integrated circuits. The semiconductor substrate 401 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate 401, depending on the stage of manufacture, often includes transistors, integrated circuitry, and the like. The substrate may also include semiconductor materials, metals, dielectrics, dopants, and other materials commonly found in semiconductor substrates.

In an embodiment, a memory array 450 may be embedded in the dielectric substrate 435. The memory array 450 may comprise a plurality of bitcells 420. The bitcells 420 may be substantially similar to the bitcells 320 described above. That is, the bitcells 420 may comprise storage elements that comprise a binary alloy phase change material, such as an alloy comprising Sb and Te. In an embodiment, the bitcells 420 may be arranged in a first row 451A and a second row 451E in different layers of the substrate 435. While two rows 451A and 451E are shown, it is to be appreciated that the memory array 450 may include one row 451 of bitcells 420 or two or more rows 451 of bitcells 420. Accordingly, embodiments disclosed herein allow for three-dimensional (3D) integration of bitcells 420 and provide the ability for enhanced memory capacity.

Figure 5:
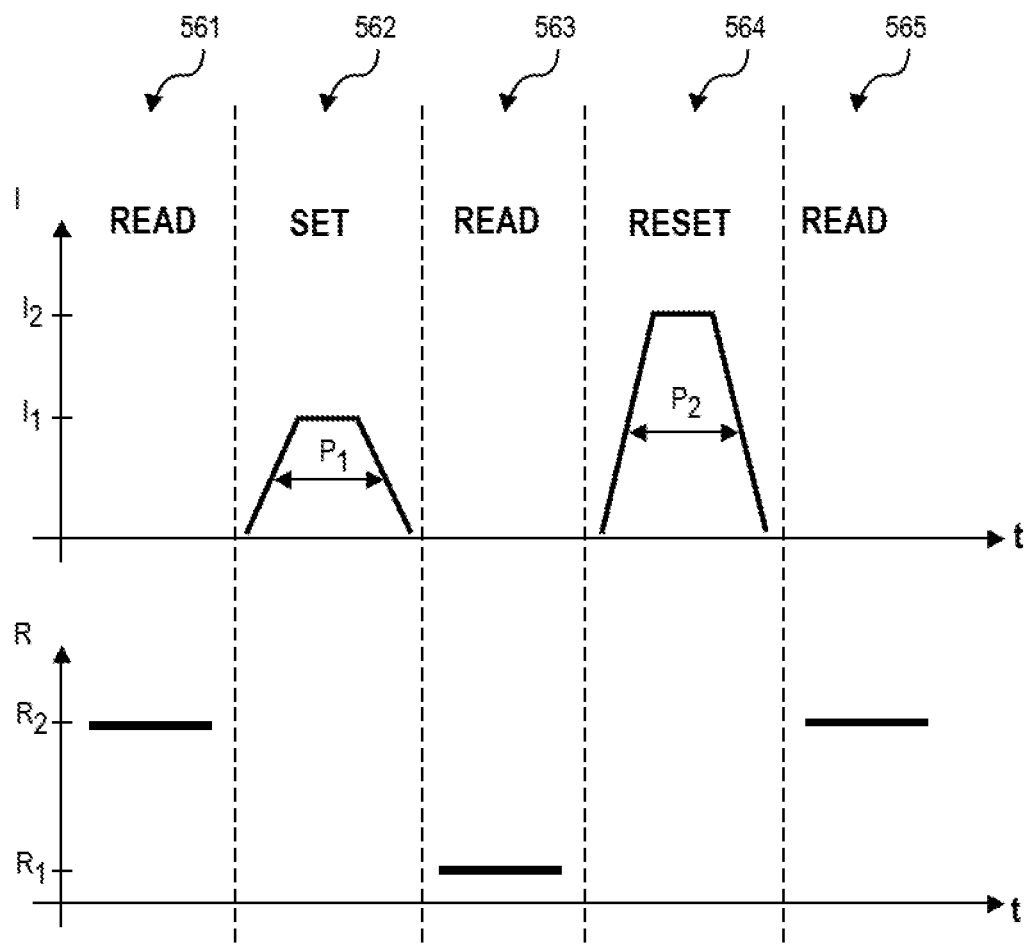
FIG. 5 is a graph that illustrates the SET pulse and the RESET pulse of a PCM device and the resulting changes in the resistivity of the PCM storage element.

Referring now to FIG. 5, a pair of graphs aligned along the time axis are shown, in accordance with an embodiment. The top graph illustrates the current with respect to time in order to illustrate the SET and RESET pulses used to switch the storage elements between the first state and the second state. The bottom graph illustrates the resistance with respect to time in order to show the resistance values of the first state and the second state.

As shown in FIG. 5, the time periods are broken up into five regions 561-565. In the first region 561, the storage element is in a first state. That is, the phase change material is in a substantially amorphous state. As such, during a READ of the storage element, the resistance of the storage element is at an elevated level (i.e., $R_2$). In region 562, a SET pulse at a first current $I_1$ is applied to the storage element. The SET pulse results in the storage element changing from the first state to a second state (e.g., a crystalline state that includes either a fully crystalline state or a partially crystalline state). Accordingly, during a READ event in region 563, the resistance is lowered to resistance $R_1$. In order to change the storage element back to the first state, a RESET pulse at a second current $I_2$ is applied in region 564. In an embodiment, the second current $I_2$ is greater than the first current $I_1$. In some embodiments, the second current $I_2$ is at least twice the first current $I_1$. A subsequent READ event in region 565 will provide an elevated resistance $R_2$.

In an embodiment, the phase change materials disclosed herein (e.g., a binary alloy comprising Sb and Te) provide improved switching speeds. In an embodiment, the switching speed (i.e., the pulse width P) may be less than 40 ns. In some embodiments, the pulse width P may be 25 ns or less, or 5 ns or less. In some embodiments, the pulse width $P_1$ of the SET pulse may be substantially equal to the pulse width $P_2$ of the RESET pulse. In other embodiments, the pulse width $P_1$ of the SET pulse may be different than the pulse width $P_2$ of the RESET pulse.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
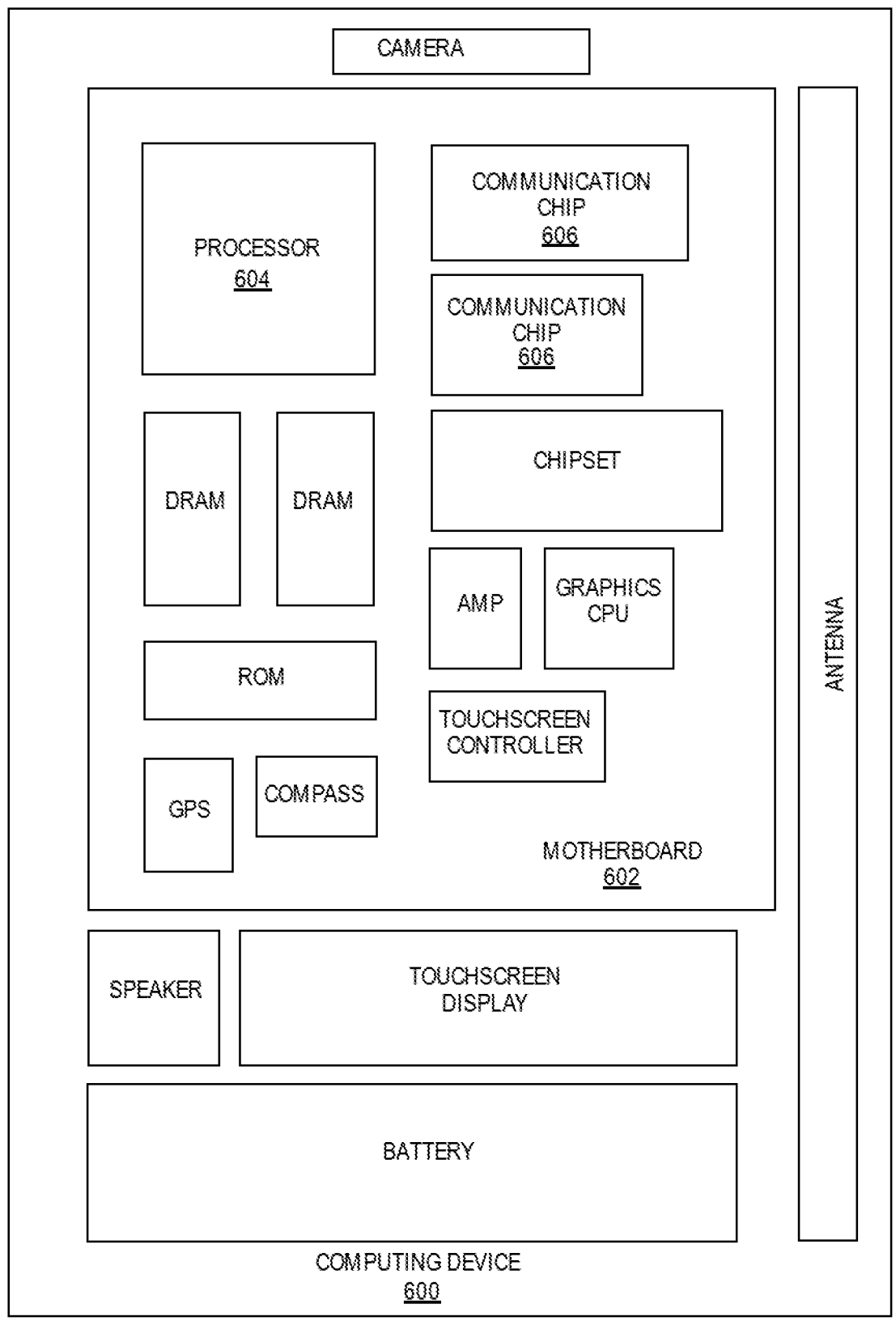
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise a memory array that comprises bitcells with a binary alloy phase change material as the storage element, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip m may comprise a memory array that comprises bitcells with a binary alloy phase change material as the storage element, as described herein.

In further implementations, another component housed within the computing device 600 may comprise a memory array that comprises bitcells with a binary alloy phase change material as the storage element, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
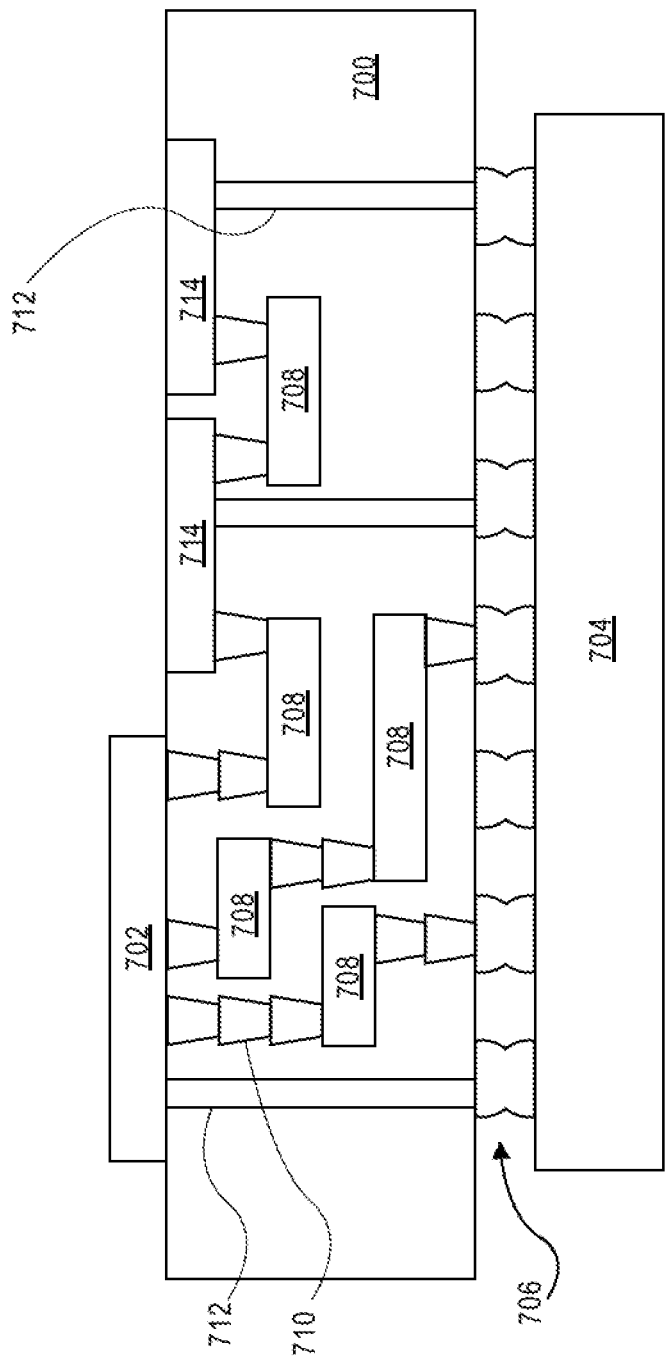
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may a memory array that comprises bitcells with a binary alloy phase change material as the storage element, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise a memory array that comprises bitcells with a binary alloy phase change material as the storage element, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a memory bitcell, comprising: a substrate; a storage element embedded in the substrate, wherein the storage element comprises a phase changing material that comprises a binary alloy; a first electrode over a first surface of the storage element; and a second electrode over a second surface of the storage element.

Example 2: the memory bitcell of Example 1, wherein the binary alloy comprises antimony (Sb) and tellurium (Te), wherein the binary alloy composition is $Sb_XTe_Y$, wherein X is greater than Y.

Example 3: the memory bitcell of Example 2, wherein X is 7 and Y is 3.

Example 4: the memory bitcell of Examples 1-3, further comprising: a selector, wherein the selector is a diode or a transistor.

Example 5: the memory bitcell of Example 4, wherein the selector is a diode, and wherein the diode is a silicon (Si) diode or a thin film diode.

Example 6: the memory bitcell of Example 5, wherein the diode is a thin film diode, and wherein the thin film diode is an ovonic threshold switch (OTS).

Example 7: the memory bitcell of Example 4, wherein the selector is a transistor, and wherein the transistor is a Si transistor or a thin film transistor.

Example 8: the memory bitcell of Examples 1-7, further comprising: a first diffusion barrier between the first electrode and the first surface; and a second diffusion barrier between the second electrode and the second surface.

Example 9: the memory bitcell of Example 8, wherein the first diffusion barrier and the second diffusion barrier comprise a refractory metal.

Example 10: the memory bitcell of Example 9, wherein the refractory metal comprises one or more of iridium (Ir), tungsten (W), tungsten nitride (WN), tantalum nitride (TaN), tantulum (Ta), and ruthenium (Ru).

Example 11: the memory bitcell of Examples 8-10, wherein the first diffusion barrier and the second diffusion barrier have thicknesses that are between approximately 2 nm and 4 nm.

Example 12: the memory bitcell of Examples 8-10, further comprising: an oxide layer between the first diffusion barrier and the first surface.

Example 13: the memory bitcell of Example 12, wherein the oxide layer comprises hafnium oxide ($HfO_2$).

Example 14: the memory bitcell of Examples 1-13, wherein a SET pulse width converts the phase changing material from an amorphous state to a crystalline state and a RESET pulse width converts the phase changing material from the crystalline state back to the amorphous state, and wherein the SET pulse width and the RESET pulse width are less than 40 ns.

Example 15: the memory bitcell of Example 14, wherein the SET pulse width and the RESET pulse width are 5 ns or less.

Example 16: the memory bitcell of Examples 1-15, wherein the memory bitcell is part of an embedded DRAM (eDRAM) device.

Example 17: a semiconductor device, comprising: a semiconductor substrate; a dielectric stack over the semiconductor substrate, wherein conductive traces and conductive vias are embedded in the dielectric stack; and an array of memory bitcells embedded in the dielectric stack, wherein each bitcell comprises: a storage element, wherein the storage element comprises a phase changing material that comprises a binary alloy.

Example 18: the semiconductor device of Example 17, wherein the array of memory bitcells is in a single layer of the dielectric stack.

Example 19: the semiconductor device of Example 17, wherein the array of memory bitcells is in more than one layer of the dielectric stack.

Example 20: the semiconductor device of Examples 17-19, wherein the binary alloy comprises antimony (Sb) and tellurium (Te), wherein an atomic percentage of Sb is greater than an atomic percentage of Te.

Example 21: the semiconductor device of Examples 17-20, wherein a SET pulse width converts the phase changing material from an amorphous state to a crystalline state and a RESET pulse width converts the phase changing material from the crystalline state back to the amorphous state.

Example 22: the semiconductor device of Example 21, wherein the SET pulse width is substantially equal to the RESET pulse width.

Example 23: the semiconductor device of Example 21 or Example 22, wherein the SET pulse width and the RESET pulse width are less than 40 ns.

Example 24: an electronic system, comprising: a board; an electronic package electrically coupled to the board; and a die electrically coupled to the electronic package, wherein the die comprises: a semiconductor substrate; a dielectric stack over the semiconductor substrate, wherein conductive traces and conductive vias are embedded in the dielectric stack; and an array of memory bitcells embedded in the dielectric stack, wherein each bitcell comprises: a storage element, wherein the storage element comprises a phase changing material that comprises a binary alloy comprising antimony (Sb) and tellurium (Te), wherein an atomic percentage of Sb in the binary alloy is greater than an atomic percentage of Te in the binary alloy.

Example 25: the electronic system of Example 24, wherein a SET pulse width converts the phase changing material from an amorphous state to a crystalline state and a RESET pulse width converts the phase changing material from the crystalline state back to the amorphous state, and wherein the SET pulse width and the RESET pulse width are less than 40 ns.

What is claimed is:
1. A memory bitcell, comprising:
   a substrate;
   a storage element embedded in the substrate, wherein the storage element comprises a phase changing material that comprises a binary alloy;
   a first electrode over a first surface of the storage element;
   a first diffusion barrier between the first electrode and the first surface;
   a second electrode over a second surface of the storage element;
   a second diffusion barrier between the second electrode and the second surface;
   a first conductive via beneath and in direct contact with the first electrode;
   a second conductive via laterally spaced apart from the storage element and laterally spaced apart from the first conductive via, the second conductive via continuous from a location below a bottom of the storage element to a location above a top of the storage element; and
   a conductive trace beneath the second conductive via and the storage element, the conductive trace coupling the first conductive via to the second conductive via.

2. The memory bitcell of claim 1, wherein the binary alloy comprises antimony (Sb) and tellurium (Te), wherein the binary alloy composition is $Sb_XTe_Y$, wherein X is greater than Y.

3. The memory bitcell of claim 2, wherein X is 7 and Y is 3.

4. The memory bitcell of claim 1, further comprising:
a selector, wherein the selector is a diode or a transistor.

5. The memory bitcell of claim 4, wherein the selector is a diode, and wherein the diode is a silicon (Si) diode or a thin film diode.

6. The memory bitcell of claim 5, wherein the diode is a thin film diode, and wherein the thin film diode is an ovonic threshold switch (OTS).

7. The memory bitcell of claim 4, wherein the selector is a transistor, and wherein the transistor is a Si transistor or a thin film transistor.

8. The memory bitcell of claim 1, wherein the first diffusion barrier and the second diffusion barrier comprise a refractory metal.

9. The memory bitcell of claim 8, wherein the refractory metal comprises one or more of iridium (Ir), tungsten (W), tungsten nitride (WN), tantalum nitride (TaN), tantalum (Ta), and ruthenium (Ru).

10. The memory bitcell of claim 9, wherein the first diffusion barrier and the second diffusion barrier have thicknesses that are between approximately 2 nm and 4 nm.

11. The memory bitcell of claim 1, further comprising:
an oxide layer between the first diffusion barrier and the first surface.

12. The memory bitcell of claim 11, wherein the oxide layer comprises hafnium oxide ($HfO_2$).

13. The memory bitcell of claim 1, wherein a SET pulse width converts the phase changing material from an amorphous state to a crystalline state and a RESET pulse width converts the phase changing material from the crystalline state back to the amorphous state, and wherein the SET pulse width and the RESET pulse width are less than 40 ns.

14. The memory bitcell of claim 13, wherein the SET pulse width and the RESET pulse width are 5 ns or less.

15. The memory bitcell of claim 1, wherein the memory bitcell is part of an embedded DRAM (eDRAM) device.

16. A semiconductor device, comprising:
a semiconductor substrate;
a dielectric stack over the semiconductor substrate, wherein conductive traces and conductive vias are embedded in the dielectric stack; and
an array of memory bitcells embedded in the dielectric stack, wherein each bitcell comprises:
a storage element, wherein the storage element comprises a phase changing material that comprises a binary alloy, and wherein the storage element is on an electrode;
a first conductive via beneath and in direct contact with the electrode;
a second conductive via laterally spaced apart from the storage element and laterally spaced apart from the first conductive via, the second conductive via continuous from a location below a bottom of the storage element to a location above a top of the storage element; and
a conductive trace beneath the second conductive via and the storage element, the conductive trace coupling the first conductive via to the second conductive via.

17. The semiconductor device of claim 16, wherein the array of memory bitcells is in a single layer of the dielectric stack.

18. The semiconductor device of claim 16, wherein the array of memory bitcells is in more than one layer of the dielectric stack.

19. The semiconductor device of claim 16, wherein the binary alloy comprises antimony (Sb) and tellurium (Te), wherein an atomic percentage of Sb is greater than an atomic percentage of Te.

20. The semiconductor device of claim 16, wherein a SET pulse width converts the phase changing material from an amorphous state to a crystalline state and a RESET pulse width converts the phase changing material from the crystalline state back to the amorphous state.

21. The semiconductor device of claim 20, wherein the SET pulse width is substantially equal to the RESET pulse width.

22. The semiconductor device of claim 20, wherein the SET pulse width and the RESET pulse width are less than 40 ns.

23. An electronic system, comprising:
a board;
an electronic package electrically coupled to the board; and
a die electrically coupled to the electronic package, wherein the die comprises:
a semiconductor substrate;
a dielectric stack over the semiconductor substrate, wherein conductive traces and conductive vias are embedded in the dielectric stack; and
an array of memory bitcells embedded in the dielectric stack, wherein each bitcell comprises:
a storage element, wherein the storage element comprises a phase changing material that comprises a binary alloy comprising antimony (Sb) and tellurium (Te), wherein an atomic percentage of Sb in the binary alloy is greater than an atomic percentage of Te in the binary alloy, and wherein the storage element is on an electrode;
a first conductive via beneath and in direct contact with the electrode;
a second conductive via laterally spaced apart from the storage element and laterally spaced apart from the first conductive via, the second conductive via continuous from a location below a bottom of the storage element to a location above a top of the storage element; and
a conductive trace beneath the second conductive via and the storage element, the conductive trace coupling the first conductive via to the second conductive via.

24. The electronic system of claim 23, wherein a SET pulse width converts the phase changing material from an amorphous state to a crystalline state and a RESET pulse width converts the phase changing material from the crystalline state back to the amorphous state, and wherein the SET pulse width and the RESET pulse width are less than 40 ns.

25. A memory bitcell, comprising:
a substrate;
a storage element embedded in the substrate, wherein the storage element comprises a phase changing material that comprises a binary alloy;
a first electrode over a first surface of the storage element;
a second electrode over a second surface of the storage element, wherein a SET pulse width converts the phase changing material from an amorphous state to a crystalline state and a RESET pulse width converts the phase changing material from the crystalline state back to the amorphous state, and wherein the SET pulse width and the RESET pulse width are less than 40 ns;
a first conductive via beneath and in direct contact with the first electrode;
a second conductive via laterally spaced apart from the storage element and laterally spaced apart from the first conductive via, the second conductive via continuous from a location below a bottom of the storage element to a location above a top of the storage element; and
a conductive trace beneath the second conductive via and the storage element, the conductive trace coupling the first conductive via to the second conductive via.

* * * * *